United States Patent
Sullivan

(10) Patent No.: US 6,309,766 B1
(45) Date of Patent: *Oct. 30, 2001

(54) POLYCRYSTALLINE SILICON CARBIDE CERAMIC WAFER AND SUBSTRATE

(76) Inventor: Thomas M. Sullivan, 2655 Rand Rd., Indianapolis, IN (US) 46241

( * ) Notice: Subject to any disclaimer, the term of this patent is extended or adjusted under 35 U.S.C. 154(b) by 0 days.

This patent is subject to a terminal disclaimer.

(21) Appl. No.: 09/295,091

(22) Filed: Apr. 21, 1999

Related U.S. Application Data

(63) Continuation-in-part of application No. 09/063,405, filed on Apr. 21, 1998, now Pat. No. 6,077,619, which is a continuation-in-part of application No. 08/624,824, filed on Mar. 27, 1996, now Pat. No. 5,850,329, which is a continuation-in-part of application No. 08/332,419, filed on Oct. 31, 1994, now Pat. No. 5,623,386.

(51) Int. Cl.⁷ ..................................................... B32B 19/00
(52) U.S. Cl. ......................... 428/698; 428/450; 428/697; 428/699
(58) Field of Search ..................................... 428/698, 697, 428/699, 469, 472, 446, 450

(56) References Cited

U.S. PATENT DOCUMENTS

| | | | |
|---|---|---|---|
| 3,681,225 | 8/1972 | Genma et al. | 205/167 |
| 3,704,211 | 11/1972 | Phillips | 205/258 |
| 4,069,360 | 1/1978 | Yanagisawa et al. | 428/64 |
| 4,239,819 | 12/1980 | Holzl | 427/255.39 |
| 4,376,963 | 3/1983 | Knoop et al. | 360/135 |
| 4,598,017 | 7/1986 | Bayer et al. | 428/336 |
| 4,637,963 | 1/1987 | Nishimatsu et al. | 428/694 |
| 4,866,005 | 9/1989 | Davis et al. | 117/98 |
| 4,875,083 | 10/1989 | Palmour | 357/23.6 |
| 4,912,063 | 3/1990 | Davis et al. | 117/98 |
| 4,947,218 | 8/1990 | Edmond et al. | 357/13 |
| 4,961,913 | 10/1990 | Sullivan | 423/351 |
| 5,200,022 | 4/1993 | Kong et al. | 156/612 |
| 5,243,204 | 9/1993 | Suzuki et al. | 257/77 |
| 5,356,522 | 10/1994 | Lal et al. | 204/192.15 |
| 5,374,412 | 12/1994 | Pickering et al. | 423/346 |
| 5,432,808 | 7/1995 | Hatano et al. | 372/45 |
| 5,463,978 | 11/1995 | Larkin et al. | 117/89 |
| 5,465,184 | 11/1995 | Pickering et al. | 360/97.01 |
| 5,623,386 | 4/1997 | Sullivan | 360/135 |
| 5,723,376 | 3/1998 | Takeuchi et al. | 438/270 |
| 5,750,434 | 5/1998 | Urushidani et al. | 438/478 |
| 5,766,343 | 6/1998 | Dmitriev et al. | 117/88 |
| 5,850,329 | 12/1998 | Sullivan | 360/135 |
| 5,978,174 | * 11/1999 | Sullivan | 360/97.01 |
| 6,077,619 | * 6/2000 | Sullivan | 428/698 |

FOREIGN PATENT DOCUMENTS

| | | |
|---|---|---|
| 57-56309 | 4/1982 | (JP) . |
| 361084873A | * 4/1986 | (JP) . |

OTHER PUBLICATIONS

Philip G. Neudeck, "Progress in Silicon Carbide Semiconductor Electronics Technology," Journal of Electronic Materials, vol. 24, No. 4, 1995.

* cited by examiner

Primary Examiner—Deborah Jones
Assistant Examiner—Stephen Stein
(74) Attorney, Agent, or Firm—Clark & Brody

(57) ABSTRACT

A substrate made of polycrystalline βSiC and having an essentially pore free surface is disclosed. The substrate is adapted for use as a wafer component to support different thinfilms as part of manufacturing for discrete or integrated circuit electronic devices. The substrate comprises a polycrystalline silicon carbide outer surface with {111} crystal planes exposed on the working surface, the outer surface is essentially pore free or without exposed pores, scratches, steps or other such depressions or discontinuities on the surface of the substrate having at least one dimension larger than 2.54 microns, and no non-stoichiometric silicon or carbon other than that which may be residual from the process of making silicon carbide ceramic material.

20 Claims, 3 Drawing Sheets

Lapped and Polished Non-Porous Coating

Porous Disk

POLYCRYSTALLINE SILICON CARBIDE CERAMIC WAFER AND SUBSTRATE

This application is a continuation-in-part of Ser. No. 09/063,405, filed Apr. 21, 1998, now U.S. Pat. No. 6,077,619 which is a continuation-in-part application of Ser. No. 08/624,824, filed Mar. 27, 1996, now U.S. Pat. No. 5,850,329 which is a continuation-in-part of Ser. No. 08/332,419, filed Oct. 31, 1994, now U.S. Pat. No. 5,623,386 both of which being incorporated by reference in their entirety herein.

FIELD OF THE INVENTION

This invention relates to substrates used to support circuit lines, transistors, capacitors, resistors, semiconductor light emitting and sensing devices, lasers and other discrete and integrated components of electronic devices such as integrated circuits and discrete devices.

BACKGROUND ART

Silicon carbide has been an attractive potential material for use in electronic devices for many years. Because silicon carbide has no low temperature phase changes, a comparatively wide energy bandgap, a high breakdown field strength, a high saturated electron drift velocity, and chemical resistance to most species commonly found in the environment of electronic device processing, silicon carbide has been an enticing, though largely unrealized candidate material for applications involving rigorous mechanical and thermal shock, as well as high operating temperatures, high power, high frequency, and intense radiation.

Many types of silicon carbide made by a variety of processes have been tried as candidate substrate materials. Previous efforts include the use of substrates made from the consolidation of finely divided ceramic powders (sintering), substrates made by various reactions of silicon metal, carbon, and other additives (sometimes referred to as the "Carborundum Process"), and substrates made by seeded sublimation (single crystal).

A silicon carbide ceramic monolith made by consolidation of finely divided particles, for example by "sintering", is too porous to support circuit lines measuring less than 0.25 microns wide. Though significant portions of the monolith may exhibit pores no larger than 1 or 2 microns, occasional larger pores measuring 75 microns across will occur which cannot be reduced in size or number by controlling the manufacturing process and therefore must be detected at great cost by measuring each part after the cost of manufacturing has been incurred.

Silicon carbide made by consolidating or reacting finely divided particles produces the wrong crystallographic form to support an electronic device. Randomly oriented hexagonal or rhombohedral or a combination thereof in crystal shape, commonly referred to as "alpha SiC", randomly oriented wafers confer random orientation to thinfilms, resulting in epilayers with non-uniform electrical properties. Device quality is limited. Researchers have shown, however, that by coating a monocrystalline alpha SiC wafer or substrate with a very thin barrier layer of silicon carbide containing a dopant such as aluminum, gallium, or phosphorus to fill vacant lattice positions, the "crystal shape memory" that would otherwise be imparted by the alpha SiC to a subsequent beta SiC epilayer can be blurred so a device quality layer of oriented beta SiC can be formed. Since βSiC has only one crystalline form, namely {111} Face Centered Cubic, oriented epilayers of βSiC have uniform electrical properties.

Large single crystal silicon carbide is made by a very slow, capital intensive process entailing the sublimation of silicon carbide onto a small single crystal seed. The process for making large single crystal silicon carbide has to date been unable to produce the standard, large diameter wafers currently preferred by device manufacturers to minimize fabrication costs. U.S. Pat. No. 4,866,005, incorporated herein in its entirety by reference, describes one such method of growing large single crystals. The largest single crystal silicon carbide substrates commercially available measure only 50 mm diameter compared to the 200 mm or 300 mm diameter substrates normally used in industry. A 50 mm substrate has only 1,962.5 $mm^2$ of potentially useable surface area on one side compared to 31,400 mm of potential surface area for a 200 mm substrate. Since it costs about the same for a device manufacturer to process a 200 mm wafer as to process a 50 mm wafer, devices made using a 200 mm wafer cost only 6.25 percent as much as devices made using 50 mm wafers. Because 50 mm substrates are only available in small quantities costing more than $2,000 per wafer, using a 200 mm substrate would represent significant savings to a device manufacturer even if the 200 mm substrate sold for $2,000.

Other issues arise from the use of large single crystal silicon carbide. Many of these issues are described by U.S. Pat. Nos. 4,912,063 and 5,200,022, incorporated entirely herein by reference. Single crystal silicon carbide is made at temperatures favoring the formation of the αSiC polytype. The "alpha" silicon carbide (αSiC) polytype is a collective reference to some 170 types of hexagonal and rhombohedral crystal shape classifications. The most common is the 6H hexagonal polytype. Most αSiC polytypes are separated by small thermodynamic differences that are difficult to control in a temperature dependent manufacturing process like that used to make large single crystals.

Beta SiC (βSiC) is the only cubic crystalline polytype of silicon carbide. Theoretically an excellent semiconductor material, deposition of βSiC with oriented crystals (also referred to as epitaxy, epilayers, or "thin films") on various ceramic or silicon metal substrates has been attempted on various occasions over many years. The difficulty of producing consistently high quality, low carrier concentration βSiC epitaxial layers on substrates or wafers other than small αSiC single crystal wafers with numerous defects has prevented any meaningful penetration of the potential market for devices in silicon carbide.

Difficulty and defects notwithstanding, electronic devices of commercial significance have been demonstrated in single crystal αSiC wafers, but never in polycrystalline or βSiC wafers. Discrete devices demonstrated in and on αSiC include Schottky diodes, PIN diodes, various types of metal oxide semiconductor field effect transistors (MOSFETs), junction field effect transistors (JFETS), metal semiconductor field effect transistors (MESFETs), gate turn-off thryristors (GTOs), integrated gate bipolar transistors (IGBTs), and static induction transistors (IGBTs). Non-volatile random access memory (NVRAM) is an example of an integrated circuit that has been done in single crystal αSiC wafers. Opto-electronic devices that either emit light or detect the emission of light have been made in αSiC single crystal wafers with either silicon carbide as an epilayer or compositions of gallium nitride, indium nitride, or aluminum nitride as epilayers. In fact, wide band gap devices have been made using GaN doped with silicon or magnesium active epilayers on αSiC single crystal wafers.

In order to provide a hospitable surface on large αSiC single crystal wafers to support epitaxial βSiC layers, αSiC substrates are sawn from crystal boules at 2 to 8 degree angles to the {0001} surface plane. Wafers are then lapped and polished to a smooth surface. Cutting the wafer from a boule at an angle to the {0001} basal plane exposes a multitude of high energy faces to nucleate growth of a SiC epilayer. The (0001) surface of 6H-SiC provides a surface that matches the Coefficient of Thermal Expansion (CTE) and lattice parameter of the (111) basal plane of βSiC very closely. Low defect PSiC epilayers have thus been applied to single crystal αSiC.

The process of lapping and polishing single crystal αSiC substrates cuts through a multitude of surfaces to expose surface features associated with higher surface energy than a broad, flat single surface. A surface intersecting multiple crystalline lattice planes creates a series of physical "steps". Multiple steps transmit three dimensional lattice information to an epitaxial layer usually causing formation of a mixture of alpha and beta polyforms in the epitaxial layer, thereby making the subject layer unsuitable for high quality devices. Applying a buffer layer containing a dopant reduces the tendency of the epilayer to form multiple polytypes, as previously mentioned.

Substrates used to support magnetic media in hard disk drives (U.S. Pat. No. 5,623,386) have demonstrated many of the attributes of chip substrates useful for making discrete and integrated circuit electronic devices. The mechanical requirements for disk drive substrates rotating at up to 10,000 rotations per minute with heads gliding less than 0.025 microns above the substrate surfaces surpass the mechanical requirements of chip substrates. Magnetic media, in turn, needs a substrate without surface defects such as pits that cause "dead spots" in the media or surface features exposing different lattice planes that cause variations in the magnetic media, commonly referred to as "noise".

The size of surface pits or defects on disk drive substrates which can be tolerated, however, is considerably larger than the size of surface defects which can be tolerated for high quality electronic devices (approximately 2 microns for disk drive substrates versus <0.1 microns for high areal density integrated circuits for example). Apart from the issue of exposing higher energy lattice positions that might cause undesirable crystalline forms, media used for disk drives is much thicker than epitaxial thinfilms used in conjunction with wafers and media can more easily "bridge" surface discontinuities. Magnetic media is also different than epitaxial thinfilms in the way it functions. Magnetic media does not require electrical continuity. Data bits in magnetic media are magnetic media are magnetic domains, the polarity of which determines whether an individual bit is either a 0 or a 1 binary code.

It has nevertheless been generally accepted that polycrystalline SiC monoliths will not support epitaxial SiC thin films of the purely beta polyform required for some high quality electrical devices. It has furthermore been generally accepted that polycrystalline silicon carbide would not have the electron mobility needed for electronic devices because the surfaces of individual crystals within a polycrystalline mass would resist the flow of electrons beyond acceptable limits.

SUMMARY OF THE INVENTION

It is the first object of this invention to reduce cost per unit of surface area for silicon carbide wafer substrates, to provide a substrate capable of increased device packing density, to improve electronic device reliability at high operating temperature and at high frequency, and to substantially increase device speed by providing a substrate with a high dielectric strength at high frequency. It is a further object of the present invention to utilize polycrystalline silicon carbide ceramic material as a material of construction for wafer substrates used to support conductive, semiconductive, dielectric, light emitting and light sensing, and other layers used in the manufacture of integrated circuits, discrete devices, semiconductor light emitting and sensing devices, and other electronic devices well known to one skilled in the art.

Furthermore, it is an object of the present invention to utilize polycrystalline βSiC ceramic material comparable to the silicon carbide used to make disk drive substrates as a material of construction for less demanding electronic device wafer substrates and a new improved version of the polycrystalline βSiC ceramic as a material of construction for higher performance, advanced technology electronic device wafer substrates used to support conductive, semiconductor, dielectric, insulator, light emitting, light sensing, capacitor and other layers used in the manufacture of discrete and integrated circuit electronic devices well known to one skilled in the art.

The present invention also provides a more efficient utilization and conservation of energy resources by using and enabling wide bandgap ceramic materials as more efficient components of electronic devices needed to control electric motors, heating elements, and process equipment using large amounts of energy.

Other objects and advantages of the present invention will become apparent as a description thereof proceeds.

In satisfaction of the foregoing objects and advantages, the present invention is directed to a substrate for discrete devices and integrated circuit electronic devices thereof which is principally made of polycrystalline silicon carbide ceramic material. In its broadest embodiment, the invention comprises the substrate component singularly or in combination with subsequent thin film coatings so as to form a part or parts of an integrated circuit or discrete device.

The substrate of the present invention comprises at least one or more of the following: a substrate used to support an electrically conductive layer, a semiconductor layer, an electrically non-conductive or insulating layer, a resistive layer, a ferroelectric layer, or semiconductor light emitting or sensing layer. The substrate is useable at temperatures over 500° C. having a single phase, highly oriented, polycrystalline silicon carbide ceramic outer surface without exposed pores, scratches, steps, or other such depressions or discontinuities in the surface of the substrate having at least one dimension larger than ~0.1 micron for high areal density electronic devices or having at least one dimension larger than 2.54 microns for low areal density electronic device applications. No non-stoichiometric silicon or carbon other than that which may be residual from the process of making silicon carbide ceramic material is present in the wafer substrate. The substrate of the present invention, made less than 600 microns thickness, has thermal conductivity which is too high to be accurately measured by the most advanced laser flash test equipment presently available. The bandgap for the wafer substrate claimed herein, is between 2.6 eV and 2.7 eV. At least one sample absorbs light between 450 nm and 470 nm of the spectrum. Early examples of the βSiC ceramic wafer claimed, had 370 $cm^2$/v-s Hall Effect mobility at $7 \times 10^{13}$/cc doping concentration. Thermoelectric probe testing indicates the wafer is fundamentally a majority carrier n-type material. The claimed wafer is a monolithic substrate with a polycrystalline βSiC surface which may be used to support one or more thinfilm layers, either similar or dissimilar, used inn combination as an electronic device.

A monolithic substrate with a polycrystalline βSiC surface can be used to support one or more layers, one or more of which is a βSiC epitaxial layer. The epitaxial thinfilm layer of βSiC adjacent to a monolithic βSiC wafer substrate can bbe utilized 10 to heal small imperfections in the substrate surface, and 2) to provide a higher purity, more nearly perfect, semiconductor layer thinfilm layer. Thinfilm layers of βSiC supported by wafers of the present invention can be doped to modify n-type carrier mobility or p-type hole mobility. Electronic devices in and on βSiC wafers described herein can be advantageously constructed using one or more layers of βSiC, each having different carrier or hole mobility. The wafer substrate can also be doped to modify carrier or hole mobility. Examples of electronic devices utilizing substrates and one or more layers of βSiC with different carrier or hole mobilities include, but are not limited to Schottky diodes, PIN diodes, and MOSFETs.

A monolithic substrate with a polycrystalline βSiC surface supporting one or more layers, can be used to support one or more light emitting, light sensing, or semiconductor layers comprised of gallium nitride, indium nitride, aluminum nitride or combinations thereof which may or may not be doped with silicon or magnesium to modify carrier or hole mobilities respectively.

A monolithic substrate with a polycrystalline βSiC surface supporting one or more thinfilm layers, can be used to support electrically conductive layers one or more of which is comprised of aluminum metal, gold metal, copper metal, silver metal or nickel metal. Metal layers can be used to connect features of an integrated circuit or to connect a discrete device with packaging.

A monolithic substrate with a polycrystalline βSiC surface supporting one ore more layers can be used to support an electrically insulating layer comprised of silicon monoxide, silicon dioxide, silicon nitride, or beryllium oxide. Conductor and semiconductor layers in electronic devices often need to be separated by insulating layers to control or isolate the flow of electric currents. Examples of electronic devices utilizing insulator layers include, but are not limited to, MOSFETs and SOI type vertical devices.

A monolithic substrate with a polycrystalline βSiC surface supporting one or layers, can be used to support one or more layers capacitor material layers comprised of tantalum dioxide or a ferroelectric material such as barium ferrite or perovskite.

The inventive wafer substrate can also be DATANITE (trademarked) made by Sullivan & Company of Indianapolis, Indiana, the DATANITE® substrate to receive the non-magnetic thinfilm coatings as used in electronic devices. This application is particularly useful for low areal density electronic device wafer use since the pore size of DATANITE® is generally less than 2.54 microns. DATANITE® is the material described in the inventor's U.S. Pat. No. 5,623,386. The thinfilm layers described herein are intended for use in electronic devices and do not encompass magnetic media material coatings adapted for use in magnetic memory recording components.

The invention also entails a silicon carbide wafer substrate comprising a top surface having an exposed polycrystalline {111} crystal plane, the top surface without exposed pores, scratches, steps or other such depressions or planar discontinuities having at least one dimension larger than 2.54 microns, preferably no larger than 0.1 microns and no non-stoichiometric silicon or carbon other than that which may be residual from the process of making silicon carbide ceramic material. In other words, the surface pore or equivalent depression having a maximum size of the largest dimension being 2.54 microns, but preferably <0.1 microns.

When employing a layer of epitaxial βSiC adjacent to a monolithic βSiC substrate, the composite can be utilized 1) to heal small imperfections in the substrate surface, and 2) to provide a higher purity, more nearly perfect, semiconductive layer.

When the thin film coating is a semiconductor material, nitrogen or phosphorous can be used to modify carrier concentration in silicon carbide as n-type dopants; aluminum or boron can be used to modify hole concentration in silicon carbide as p-type dopants; silicon can be used to modify carrier concentration in gallium nitride, indium nitride, or aluminum nitride or compositions thereof as an n-type dopant; and magnesium can be used to modify the hole concentration in gallium nitride, indium nitride, or aluminum nitride or compositions thereof as a p-type dopant.

DESCRIPTION OF THE PREFERRED EMBODIMENTS

Each embodiment of the present invention provides a polycrystalline βSiC chip wafer substrate having a relatively featureless, non-porous silicon carbide ceramic surface substantially free of higher energy lattice positions. The non-porous silicon carbide ceramic surface covers an area of the substrate intended for use as a substrate to support additional layers comprising an electronic device. Thus, the usable surface of the component may not be its entire surface, so there could be areas of porous surface, defect-containing surface in portions of the substrate.

The inventive βSiC ceramic wafer substrates are polycrystalline. Grain or crystal size is very small and predominantly oriented so that the {111} surface is the only exposed crystallography on a wafer face for all practical purposes. A small minority (<5%) of the surface area of the βSiC wafer face may not be oriented with the {111} surface exposed. The majority orientation of the wafer face appears to predominate orientation of subsequent layers. The nearly amorphous nature of the material appears to encourage crystal cleavage along sympathetic planes. Polycrystalline βSiC ceramic wafer substrates can thus be made in very large diameters consistent with the most commonly used, SEMI standard sized wafers, e.g. 150 mm or 200 mm SEMI standard size wafers. Unlike monocrystalline wafers, mechanical surfaces on polycrystalline βSiC wafers do not tend to expose "steps" or other high energy surface features because individual crystal size is very small.

Regardless of the ability to make large diameter wafers, a substrate must be able to support epitaxial thin film coatings in order to make high quality electronic devices. The inventor has discovered by means of high angle X-ray diffraction analyses that silicon carbide, such as that described by U.S. Pat. No. 5,623,386, is highly oriented with the same face of the {111} Face Centered Cubic crystal exposed on the broad, flat surface which might be used as a wafer. The {111} crystallography of the silicon carbide was always present in the material cited for disk drive components, but previously unknown. Though relatively insignificant with respect to the use of silicon carbide for disk drive components because of the different function of magnetic recording media as compared to thinfilms, discovery of the crystallographic orientation is important for the use of the material as a substrate wafer for discrete and integrated circuit electronic devices. In fact, silicon carbide used for magnetic recording media or disk drive substrates can also be used as ceramic wafer substrates to support thinfilms comprising lower grade electronic devices. New and improved versions of the silicon carbide used for disk drive applications having reduced surface pore sizes with lower numerical incidence are useful as substrates or wafers for high quality electronic devices.

Figure 1:
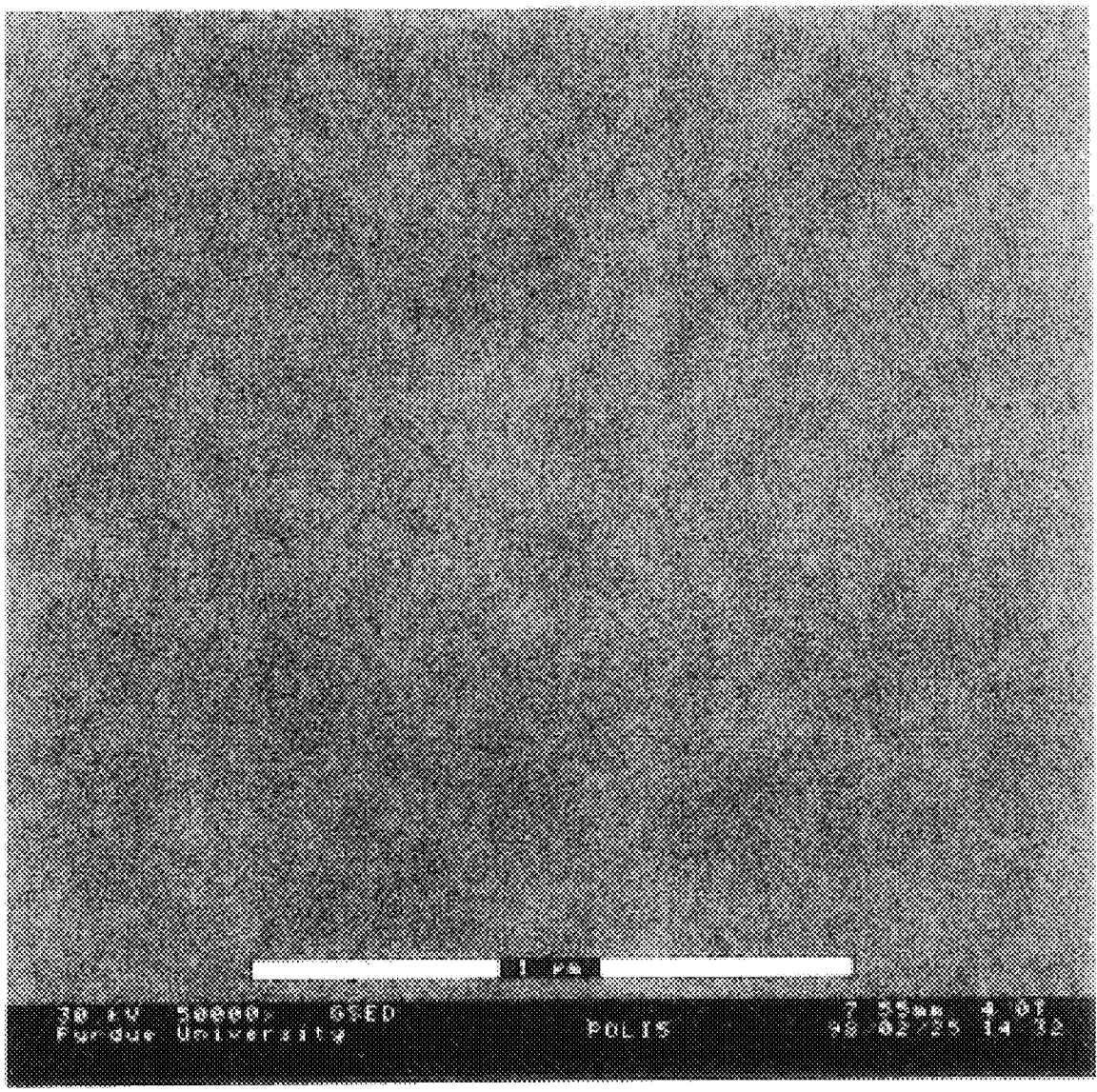
FIG. 1 shows a photomicrograph at 50,000 magnification of a 65 mm substrate of polycrystalline βSiC showing an essentially pore free surface.
Figure 2:
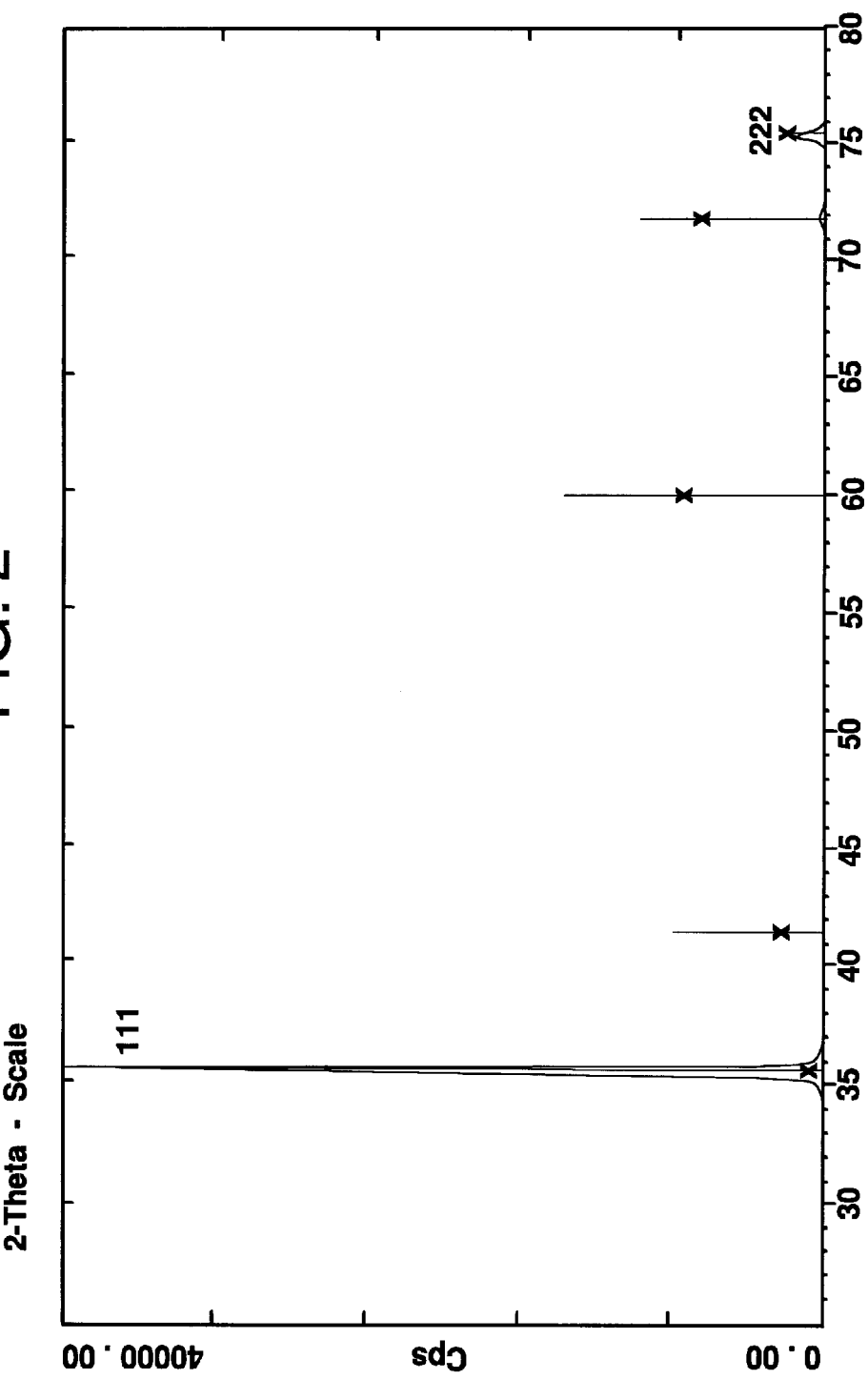
FIG. 2 shows an X-ray diffraction pattern of the substrate of FIG. 1 showing the {111} crystallography of 3C βSiC as peak curves along with a superimposed crystallographic pattern for αSiC for purposes of comparison.

Polycrystalline pSiC ceramic monoliths, though comprised of great multitudes of tightly packed βSiC crystals, are oriented, uniform, and more compatible with βSiC epilayers than is monocrystalline αSiC. Numerous high angle x-ray diffraction patterns taken from a single sample of a DATANITE® wafer substrate at different locations on that sample showed not a single crystal form other than {111} Face Centered Cubic 3C βSiC. FIG. 2 is one such diffraction pattern showing an individual βSiC crystal in a polycrystalline mass clearly indicating {111} Face Centered Cubic 3C βSiC. FIG. 2 also shows a superimposed pattern for αSiC evidencing the different crystallography thereof.

Epitaxial thin films deposited on polycrystalline βSiC wafer substrates orient so that crystallography of the deposited thin film compliments the {111} surface plane of the substrate with respect to lattice parameter and coefficient of thermal expansion. βSiC substrate surface energy favors formation of a βSiC epilayer from a coating process conducive to βSiC. Deposition of βSiC thinfilms on polycrystalline βSiC wafers is homoepitaxial. Both lattice parameter and coefficient of thermal expansion match almost perfectly, regardless of the level of doping. The epitaxial layer thus forms without stacking faults and associated dislocations. Thinfilms other than SiC having lattice parameter and coefficient of thermal expansion comparable to βSiC can also be deposited or grown on polycrystalline βSiC wafers to make discrete and integrated circuit electronic devices.

Like silicon, the hole or carrier concentration βSiC can be doped to form p-type and n-type layers respectively. Aluminum and boron dopants can be incorporated into βSiC thinfilms as partial pressures during the Chemical Vapor Deposition (CVD) process to form p-type layers. Likewise, nitrogen and phosphorus can be incorporated to form n-type layers. Dopants may also be ion implanted by means well known to one skilled in the art. It will be recognized that both discrete and integrated circuit electronic devices are comprised of two or more thinfilms or regions having different levels of doping or types of dopant. Examples include, but are not limited to Schottky diodes, PIN diodes, and MOSFETs.

Polycrystalline βSiC wafers also support electrically insulating, high dielectric strength thin films. Silicon monoxide, silicon dioxide, silicon nitride and beryllium oxide have high dielectric strength. Because silicon carbide substrates and silicon carbide semiconductors can withstand high temperatures, insulators and diffusion barriers can be applied at high deposition temperatures or withstand high temperature annealing or ignition.

Temperatures of ≈900–1000° C., for example, enable deposition of silicon nitride by CVD from the reaction of silane and ammonia with an almost ideal silicon-nitrogen ratio. The resulting film has a 9.4 dielectric constant and electrical conductivity of $10^{-13}$ to $10^{-14}$-ohm$^{-1}$-cm$^{-1}$. For another example, BeO deposited as an insulative film by reactive sputtering on a DATANITE® silicon carbide substrate can be "ignited" or annealed at high temperature to practically eliminate solubility in acids, solutions of fixed alkali hydroxides, or water. BeO has the highest thermal conductivity of all electrical insulators at >180 W/m·° K at 100° C., electrical resistivity of $4\times10^{14}$ Microhm-cm at 600° C., and a 6.57 dielectric constant at 8.5 GHz.

Ferroelectrics and tantalum oxide thin films used to make capacitors and resistors also benefit from polycrystalline βSiC substrates. Barium ferrite either with CoTi doping or without doping, in general having magnetoplumbite structure, for example, normally has a crystallization temperature ~800° C., though processes using lower annealing temperatures ~600° C. have been successfully used. Polycrystalline βSiC substrates are compatible with temperatures up to ~1100° C., high temperature ferroelectric thinfilms such as barium ferrite can be deposited at high temperature to make sure of maximum homogeneity with CoTi grain growth inhibiting dopants. Tantalum oxide can also be applied to polycrystalline βSiC substrates to form thinfilm capacitors and resistors at high deposition temperatures.

Circuits can be connected with thin metal lines deposited on polycrystalline βSiC wafers. Metal lines in interfacial contact with wafers or thin films on wafers generate heat as electric current passes through the line. Silicon metal reacts with many metals and ceramic materials at elevated temperatures to form silicides having different electrical properties than those intended. Polycrystalline βSiC wafers support devices that will operate for longer periods at higher temperatures than comparable devices formed on silicon wafers.

Very small lines contribute materially to the enablement of smaller, more compact devices with more tools or features that operate at faster speeds and higher temperatures. Control devices operating energy consuming processes or equipment such as chemical processes, oil refineries, or automobiles, can be made to respond to input signals faster and thereby save energy.

Polycrystalline βSiC wafers are compatible with other wide bandgap materials like GaN, InN, AlN and compositions thereof can be applied to form devices by means well known to one skilled in the art. Additions of small quantities of silicon or magnesium, amounting to less than 0.3% by weight, can be used to modify carrier or hole concentration as dopants for GaN, InN, and AlN and compositions thereof.

Formed to "near-net-shape" rather than sawn from a single crystal, polycrystalline βSiC wafer substrate surfaces made in accordance with this invention can be lapped, polished, and etched to <0.18 μm site flatness on 25×32 mm sites surface roughness. The front side of polycrystalline βSiC wafer substrates are polished in one or more steps to surface roughness measuring <5.0 Å Ra while the back side is typically finished to a lower standard with surface roughness measuring <15.0 Å Ra. Double-side polishing both front and back of a chip wafer is conducive to surface planarity. The surface finish and planarity of the front side of a chip wafer substrate governs, in part, the achievable resolution of circuit lines and other details of an electronic device formed thereon. A fine surface finish on the backside of a chip wafer substrate reduces the tendency of the chip wafer to "hold" contaminants, though one skilled in the art will recognize that under certain circumstances it may be advantageous to leave the back side of a wafer in a rougher state of surface finish the face.

Polycrystalline βSiC wafer substrates are formed as thin, flat "blanks", slightly thicker and larger in diameter for round substrates or longer sided for square substrates than the finished article. The substrates can be made larger than any standard substrates presently contemplated, including but not limited to 450 mm diameter substrates. Though larger sized finishing tools are needed for large sized substrates, the process technology for polycrystalline silicon carbide wafer substrates is not limited to making small, expensive silicon carbide substrates. Since it costs relatively the same to process a large diameter wafers as a small wafer, the cost of fabricating devices on wafers decreases in proportion to the surface area of the wafer. The trend in the semiconductor industry is toward ever larger wafers to reduce costs. Unlike single crystal αSiC wafers, polycrystalline βSiC wafers can be made in very large sizes and therefore, devices can be fabricated on polycrystalline beta silicon carbide at very low cost.

Figure 3:
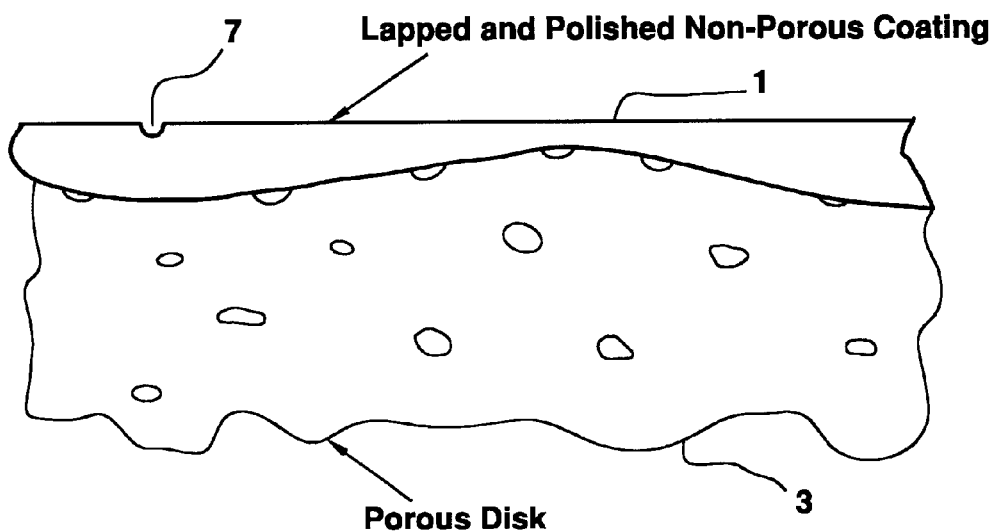
FIG. 3 shows a cross-sectional view of a polished substrate made in accordance with some of the embodiments of the present invention.

One embodiment of the present invention provides the aforesaid, relatively non-porous, silicon carbide ceramic surface 1 on a comparatively porous silicon carbide monolith 3 having pores 5 larger than the <0.1 μ pores 7 which might be tolerated on the surface of the substrate as in FIG. 3. Another embodiment provides a ceramic substrate with few pores, either internally or externally exposed, larger than 0.1 μ. The non-porous surface of FIG. 3 has utility in head applications, disk substrates, chip substrates and any other components disclosed herein.

Substrate materials used for disks and disk drive heads can also be used as substrates for less demanding discrete and integrated circuit electronic device applications as long as the maximum pore size is significantly smaller than the line thickness of the electronic device. As U.S. patent application No. 08/624,824 points out, "minimizing exposed pores (or other surface discontinuities) is important to . . . prevent discontinuities in circuits printed on the surface." U.S. patent application Ser. No. 08/624,824 is incorporated into this application by reference. The inventor has recently discovered that improvements in process equipment cleanliness and raw material purity significantly reduce the number and size of surface defects. Reduction of surface defect size and numerical frequency, in turn, allows reducing line or feature size to enable manufacture of high quality devices in polycrystalline βSiC.

None of the preferred embodiments of the present invention utilize silicon metal to fill surface pores or to densify a porous ceramic monolith. Very small amounts of non-stoichiometric silicon metal or carbon are, however, common byproducts or coproducts of the making of silicon carbide ceramic by powder metallurgical, chemical vapor deposition, or supercritical fluid processing methods. Raw material purity and process equipment cleanliness are critical to the manufacture of polycrystalline βSiC wafers for high quality devices. While thermodynamics and the reactivity of chemical species govern crystal orientation and compound stoichiometry; impurities, whether from reactants or from process equipment, control pore size and the numerical incidence of pores inn addition to occasional grain growth. Higher purity and cleanliness are always better. The level of purity is largely determined by the requirement of the electronic device in terms of line size, line thickness, and thinfilm orientation. U.S. Pat. Nos. 4,239,819, 4,961,913, and 5,623,386 are incorporated into this application by reference. U.S. Pat. Nos. 4,239,819, 4,912,063 and 4,961,913 exemplify the methods as part of making the substrate disclosed in U.S. Pat. No. 5,623,386 and exemplify methods for the instant invention taking into account the disclosure above regarding purity and cleanliness.

Figure 4A:
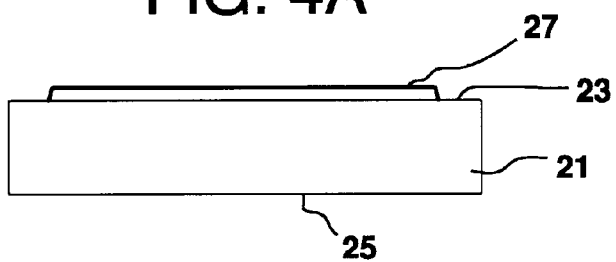
FIG. 4A shows the inventive wafer with a thinfilm coating thereon.

FIG. 4A shows a wafer 21 having a top surface 23 and a bottom surface 25. The wafer surface 23 is essentially pore free as defined above in terms of the absences of pores, depressions or the like having a dimension no greater than 2.54 microns, preferably less than 0.1 microns and the wafer is made of the silicon carbide as described above. The surface 23 has a thinfilm coating 27 thereon. The coating is shown covering only a portion of the entire surface 23 but total coverage of the surface 23 is within the scope of the invention. Often times, the thinfilm is applied and partially removed when making an integrated circuit or other electrical structure on a wafer, e.g., a transistor. Although one thinfilm is shown, a plurality could be applied on the wafer as part of the electrical component manufacture. Exemplary processing steps include applying a silicon nitride layer and partially etching or patterning it. A thermal oxide thinfilm can then be grown around the nitride followed by removal of the nitride layer. A gate oxide can then be grown followed by deposition of a polycrystalline silicon or silicon carbide thinfilm. The polycrystalline silicon or silicon carbide is patterned and a self aligned etch of the exposed oxide takes place. The exposed silicon or silicon carbide is doped and reoxidation takes place. Contact windows are opened and a metal film is deposited and patterned so as to interconnect with one or more other devices on the substrate. A plurality of such devices can be formed as part of an integrated circuit.

Figure 4B:
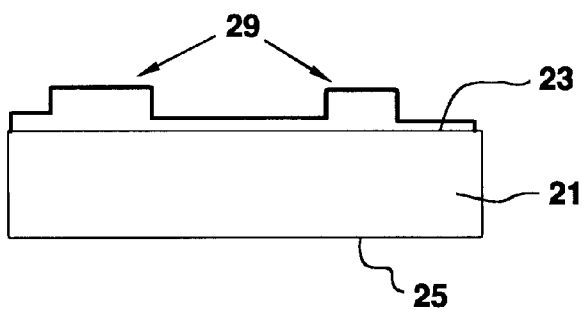
FIG. 4B shows a wafer and electronic devices in schematic form.

FIG. 4B shows a schematic representation of the wafer 21 and devices 29 which are intended to schematically represent a plurality of devices to form an integrated circuit. The devices 29 are intended to represent known or contemplated devices requiring a substrate for device support as part of an electrical component, e.g., an integrated circuit.

As such, an invention has been disclosed in terms of preferred embodiments thereof which fulfills each and every one of the objects of the present invention as set forth above and provides a new and improved substrate for particular use as a wafer for discrete and integrated electronic devices.

Of course, various changes, modifications and alterations from the teachings of the present invention may be contemplated by those skilled in the art without departing from the intended spirit and scope thereof. It is intended that the present invention only be limited by the terms of the appended claims.

What is claimed is:

1. A wafer structure component used in the making of discrete or integrated circuit devices comprising a working surface, at least a portion of the working surface comprising a polycrystalline beta silicon carbide outer surface with {111} crystallographic planes exposed on the working surface, the portion of the working surface being without exposed pores, scratches, steps, or other such depressions or discontinuities on the surface of the substrate having at least one dimension larger than 0.1 micron, and no non-stoichiometric silicon or carbon other than that which may be residual from the process of making silicon carbide ceramic material.

2. The substrate of claim 1 wherein the substrate is finished to <5 Å Ra on the portion that is the working surface side or "face" and <20 Å Ra on a surface opposite the working surface or "back" side.

3. The substrate of claim 1 wherein the substrate is finished to <0.4 microns Ra on both sides for use as a test wafer.

4. A beta silicon carbide substrate comprising a top and bottom surface, the top surface having an exposed polycrystalline {111} crystallographic plane, and being without exposed pores, scratches, steps, or other such depressions or discontinuities on the surface of the substrate having at least one dimension larger than 2.54 microns, and no non-stoichiometric silicon or carbon other than that which may be residual from the process of making silicon carbide ceramic material.

5. The substrate of claim 4, wherein the dimension is no larger than 0.1 micron.

6. A laminate comprising the substrate of claim 1 and a non-magnetic thin film coating on the outer surface.

7. The laminate of claim 6 wherein the thin film coating is selected from the group consisting of a metallic material, an electrical insulating material, a ferroelectric material, a resistive material, a semiconductor material, a light emitting material, and a light sensing material.

8. An integrated circuit electronic device including the laminate structure of claim 7.

9. A discrete device including the laminate structure of claim 7.

10. The laminate of claim 7, wherein the substrate is finished to <5 Å Ra on a portion of the wafer that is used to support the laminates and <20 Å Ra on the surface opposite the working surface.

11. The laminate of claim 7, wherein the metallic material contains gold, aluminum, silver, or copper.

12. The laminate of claim 7, wherein the electrical insulating material is one of silicon monoxide, silicon dioxide, silicon nitride, or beryllium oxide.

13. The laminate of claim 7, wherein the ferroelectric material is one of tantalum dioxide, barium ferrite, or perovskite.

14. The laminate of claim 7, wherein the semiconductor layer is at least one of beta silicon carbide, gallium nitride, indium nitride or aluminum nitride.

15. The laminate of claim 7, wherein the light emitting material or the light sensing material is selected from the group consisting of gallium nitride, indium nitride, aluminum nitride, and a composition containing two or more of gallium nitride, indium nitride, or aluminum nitride.

16. The laminate of claim 14, wherein the semiconductor layer is beta silicon carbide containing nitrogen or phosphorous in as n-type dopants for carrier concentration modification.

17. The laminate of claim 14, wherein the semiconductor layer is beta silicon carbide containing aluminum or boron as p-type dopants for hole concentration modification.

18. The laminate of claim 14, wherein the semiconductor layer is a material selected from the group consisting of gallium nitride, indium nitride, aluminum nitride, and a composition containing two or more of gallium nitride, indium nitride, or aluminum nitride, the material containing silicon as an n-type dopant for carrier concentration modification.

19. The laminate of claim 14, wherein the semiconductor layer is a material selected from the group consisting of gallium nitride, indium nitride, aluminum nitride, and a composition containing two or more of gallium nitride, indium nitride, or aluminum nitride, the material containing magnesium as an p-type dopant for hole concentration modification.

20. The laminate of claim 7, wherein the semiconductor layer is a composition containing two or more of gallium nitride, indium nitride, or aluminum nitride.

* * * * *